(12) United States Patent
DeMuth et al.

(10) Patent No.: US 11,691,341 B2
(45) Date of Patent: Jul. 4, 2023

(54) PART MANIPULATION USING PRINTED MANIPULATION POINTS

(71) Applicant: Seurat Technologies, Inc., Mountain View, CA (US)

(72) Inventors: James A. DeMuth, Woburn, MA (US); Erik Toomre, Los Altos, CA (US); Francis L. Leard, Sudbury, MA (US); Kourosh Kamshad, Hudson, NH (US); Heiner Fees, Bietigheim-Bissingen (DE); Eugene Berdichevsky, Oakland, CA (US)

(73) Assignee: Seurat Technologies, Inc., Wilmington, MA (US)

( * ) Notice: Subject to any disclaimer, the term of this patent is extended or adjusted under 35 U.S.C. 154(b) by 178 days.

(21) Appl. No.: 15/336,581

(22) Filed: Oct. 27, 2016

(65) Prior Publication Data

US 2017/0120387 A1 May 4, 2017

Related U.S. Application Data

(60) Provisional application No. 62/248,783, filed on Oct. 30, 2015, provisional application No. 62/248,839, (Continued)

(51) Int. Cl.
*B23K 37/04* (2006.01)
*B29C 64/264* (2017.01)
(Continued)

(52) U.S. Cl.
CPC ............ *B23K 37/0408* (2013.01); *B22F 3/24* (2013.01); *B22F 10/00* (2021.01); *B22F 10/28* (2021.01); *B22F 10/34* (2021.01); *B22F 10/36* (2021.01); *B22F 10/70* (2021.01); *B22F 12/00* (2021.01); *B22F 12/226* (2021.01); *B22F 12/30* (2021.01);
(Continued)

(58) Field of Classification Search
None
See application file for complete search history.

(56) References Cited

U.S. PATENT DOCUMENTS

| 4,247,508 A | 1/1981 | Housholder |
| 4,944,817 A | 7/1990 | Bourell |

(Continued)

FOREIGN PATENT DOCUMENTS

| CN | 1593817 A | 3/2005 |
| DE | 102007048385 | 1/2009 |

(Continued)

OTHER PUBLICATIONS

Gibson (Rapid Prototyping Journal; Bradford vol. 2, Iss. 2, (1996): 32-38) (Year: 1996).*

*Primary Examiner* — Joel G Horning
(74) *Attorney, Agent, or Firm* — David R. Stevens; Stevens Law Group

(57) ABSTRACT

A manipulator device such as a robot arm that is capable of increasing manufacturing throughput for additively manufactured parts, and allows for the manipulation of parts that would be difficult or impossible for a human to move is described. The manipulator can grasp various permanent or temporary additively manufactured manipulation points on a part to enable repositioning or maneuvering of the part.

16 Claims, 12 Drawing Sheets

Related U.S. Application Data filed on Oct. 30, 2015, provisional application No. 62/248,969, filed on Oct. 30, 2015, provisional application No. 62/248,780, filed on Oct. 30, 2015, provisional application No. 62/248,847, filed on Oct. 30, 2015, provisional application No. 62/248,835, filed on Oct. 30, 2015, provisional application No. 62/248,848, filed on Oct. 30, 2015, provisional application No. 62/248,770, filed on Oct. 30, 2015, provisional application No. 62/248,787, filed on Oct. 30, 2015, provisional application No. 62/248,841, filed on Oct. 30, 2015, provisional application No. 62/248,799, filed on Oct. 30, 2015, provisional application No. 62/248,968, filed on Oct. 30, 2015, provisional application No. 62/248,765, filed on Oct. 30, 2015, provisional application No. 62/248,776, filed on Oct. 30, 2015, provisional application No. 62/248,829, filed on Oct. 30, 2015, provisional application No. 62/248,791, filed on Oct. 30, 2015, provisional application No. 62/248,795, filed on Oct. 30, 2015, provisional application No. 62/248,758, filed on Oct. 30, 2015, provisional application No. 62/248,989, filed on Oct. 30, 2015, provisional application No. 62/248,980, filed on Oct. 30, 2015, provisional application No. 62/248,966, filed on Oct. 30, 2015, provisional application No. 62/248,833, filed on Oct. 30, 2015, provisional application No. 62/248,821, filed on Oct. 30, 2015.

(51) Int. Cl.

| | | |
|---|---|---|
| B29C 64/153 | (2017.01) | |
| B33Y 10/00 | (2015.01) | |
| B33Y 40/00 | (2020.01) | |
| B33Y 50/02 | (2015.01) | |
| B33Y 70/00 | (2020.01) | |
| B33Y 80/00 | (2015.01) | |
| B33Y 99/00 | (2015.01) | |
| B23K 26/12 | (2014.01) | |
| B23K 26/142 | (2014.01) | |
| B23K 26/144 | (2014.01) | |
| B23K 26/70 | (2014.01) | |
| B29C 64/386 | (2017.01) | |
| B29C 64/268 | (2017.01) | |
| B22F 3/24 | (2006.01) | |
| B23K 15/00 | (2006.01) | |
| B23K 15/06 | (2006.01) | |
| B23K 26/03 | (2006.01) | |
| B23K 26/08 | (2014.01) | |
| B23K 26/16 | (2006.01) | |
| B23K 26/36 | (2014.01) | |
| B25J 11/00 | (2006.01) | |
| G02B 7/14 | (2021.01) | |
| G02B 7/16 | (2021.01) | |
| G02B 7/182 | (2021.01) | |
| G02B 15/04 | (2006.01) | |
| G02B 15/10 | (2006.01) | |
| G02B 19/00 | (2006.01) | |
| G02F 1/01 | (2006.01) | |
| G02F 1/1333 | (2006.01) | |
| G02F 1/135 | (2006.01) | |
| G05B 17/02 | (2006.01) | |
| H01S 5/40 | (2006.01) | |
| B22F 10/00 | (2021.01) | |
| H01S 5/00 | (2006.01) | |
| B22F 12/33 | (2021.01) | |
| B22F 12/44 | (2021.01) | |
| B22F 12/70 | (2021.01) | |
| B22F 12/00 | (2021.01) | |
| G02B 27/10 | (2006.01) | |
| B22F 10/28 | (2021.01) | |
| B22F 10/70 | (2021.01) | |
| B22F 12/30 | (2021.01) | |
| B22F 12/88 | (2021.01) | |
| B22F 12/90 | (2021.01) | |
| B22F 10/34 | (2021.01) | |
| B22F 10/36 | (2021.01) | |
| B23K 26/00 | (2014.01) | |
| B23K 26/082 | (2014.01) | |
| B23K 101/00 | (2006.01) | |
| B23K 101/24 | (2006.01) | |
| B23K 103/00 | (2006.01) | |
| B23K 101/02 | (2006.01) | |
| B29K 105/00 | (2006.01) | |
| G02B 27/28 | (2006.01) | |
| G07C 3/14 | (2006.01) | |
| B22F 10/73 | (2021.01) | |
| B22F 12/17 | (2021.01) | |
| B22F 12/20 | (2021.01) | |
| B22F 12/41 | (2021.01) | |
| B22F 12/45 | (2021.01) | |
| B22F 12/53 | (2021.01) | |
| B22F 10/47 | (2021.01) | |
| B22F 10/32 | (2021.01) | |
| B22F 10/50 | (2021.01) | |
| B22F 10/64 | (2021.01) | |
| B22F 10/10 | (2021.01) | |
| B33Y 30/00 | (2015.01) | |
| B23K 26/342 | (2014.01) | |
| B28B 1/00 | (2006.01) | |
| G02B 26/08 | (2006.01) | |
| G02B 27/09 | (2006.01) | |
| G02B 27/14 | (2006.01) | |
| G02B 27/00 | (2006.01) | |

(52) U.S. Cl.
CPC ............. *B22F 12/33* (2021.01); *B22F 12/38* (2021.01); *B22F 12/44* (2021.01); *B22F 12/70* (2021.01); *B22F 12/88* (2021.01); *B22F 12/90* (2021.01); *B23K 15/002* (2013.01); *B23K 15/0006* (2013.01); *B23K 15/0013* (2013.01); *B23K 15/0026* (2013.01); *B23K 15/0093* (2013.01); *B23K 15/06* (2013.01); *B23K 26/03* (2013.01); *B23K 26/032* (2013.01); *B23K 26/083* (2013.01); *B23K 26/0846* (2013.01); *B23K 26/123* (2013.01); *B23K 26/127* (2013.01); *B23K 26/1224* (2015.10); *B23K 26/142* (2015.10); *B23K 26/144* (2015.10); *B23K 26/16* (2013.01); *B23K 26/36* (2013.01); *B23K 26/702* (2015.10); *B23K 26/703* (2015.10); *B23K 26/704* (2015.10); *B23K 37/0426* (2013.01); *B25J 11/00* (2013.01); *B29C 64/153* (2017.08); *B29C 64/264* (2017.08); *B29C 64/268* (2017.08); *B29C 64/386* (2017.08); *B33Y 10/00* (2014.12); *B33Y 40/00* (2014.12); *B33Y 50/02* (2014.12); *B33Y 70/00* (2014.12); *B33Y 80/00* (2014.12); *B33Y 99/00* (2014.12); *G02B 7/14* (2013.01); *G02B 7/16* (2013.01); *G02B 7/1827* (2013.01); *G02B 15/04* (2013.01); *G02B 15/10* (2013.01); *G02B 19/0028* (2013.01); *G02B 19/0047* (2013.01); *G02B 27/108*

(2013.01); *G02F 1/0136* (2013.01); *G02F 1/135* (2013.01); *G02F 1/133362* (2013.01); *G05B 17/02* (2013.01); *H01S 5/005* (2013.01); *H01S 5/4012* (2013.01); *B22F 10/10* (2021.01); *B22F 10/32* (2021.01); *B22F 10/47* (2021.01); *B22F 10/50* (2021.01); *B22F 10/64* (2021.01); *B22F 10/73* (2021.01); *B22F 12/17* (2021.01); *B22F 12/20* (2021.01); *B22F 12/222* (2021.01); *B22F 12/41* (2021.01); *B22F 12/45* (2021.01); *B22F 12/53* (2021.01); *B22F 2003/247* (2013.01); *B22F 2003/248* (2013.01); *B22F 2998/10* (2013.01); *B22F 2999/00* (2013.01); *B23K 15/0086* (2013.01); *B23K 26/0006* (2013.01); *B23K 26/082* (2015.10); *B23K 26/342* (2015.10); *B23K 2101/001* (2018.08); *B23K 2101/008* (2018.08); *B23K 2101/02* (2018.08); *B23K 2101/24* (2018.08); *B23K 2103/00* (2018.08); *B23K 2103/42* (2018.08); *B23K 2103/50* (2018.08); *B28B 1/001* (2013.01); *B29K 2105/251* (2013.01); *B33Y 30/00* (2014.12); *G02B 26/0816* (2013.01); *G02B 27/0068* (2013.01); *G02B 27/0905* (2013.01); *G02B 27/141* (2013.01); *G02B 27/283* (2013.01); *G02B 27/286* (2013.01); *G05B 2219/49023* (2013.01); *G07C 3/146* (2013.01); *Y02P 10/25* (2015.11); *Y02P 80/40* (2015.11)

(56) References Cited

U.S. PATENT DOCUMENTS

| | | | |
|---|---|---|---|
| 5,155,324 A | 10/1992 | Deckard | |
| 5,236,637 A | 8/1993 | Hull | |
| 5,314,003 A | 5/1994 | Mackay | |
| 5,382,308 A | 1/1995 | Bourell | |
| 5,508,489 A | 4/1996 | Benda | |
| 5,640,667 A | 6/1997 | Freitag | |
| 5,674,414 A | 10/1997 | Schweizer | |
| 5,837,960 A | 11/1998 | Lewis | |
| 6,005,717 A | 12/1999 | Neuberger | |
| 6,405,095 B1 | 6/2002 | Jang | |
| 6,462,306 B1 | 10/2002 | Kitai | |
| 6,560,001 B1 | 5/2003 | Igasaki | |
| 6,676,892 B2 | 1/2004 | Das | |
| 6,717,106 B2* | 4/2004 | Nagano | B23K 26/0604 219/121.65 |
| 7,077,638 B2 | 7/2006 | Leyden | |
| 7,088,432 B2 | 8/2006 | Zhang | |
| 7,444,046 B2 | 10/2008 | Karlsen | |
| 7,509,738 B2 | 3/2009 | Adams | |
| 7,569,174 B2 | 8/2009 | Ruatta | |
| 7,713,048 B2 | 5/2010 | Perret | |
| 7,820,241 B2 | 10/2010 | Perret | |
| 8,046,097 B2 | 10/2011 | Hull | |
| 8,155,775 B2 | 4/2012 | Batchelder | |
| 8,199,787 B2 | 6/2012 | Deri | |
| 8,470,231 B1 | 6/2013 | Dikovsky | |
| 8,514,475 B2 | 8/2013 | Deri | |
| 8,525,943 B2 | 9/2013 | Burgess | |
| 8,568,646 B2 | 10/2013 | Wang | |
| 8,666,142 B2 | 3/2014 | Shkolnik | |
| 8,784,720 B2 | 7/2014 | Oberhofer | |
| 8,801,418 B2 | 8/2014 | El-siblani | |
| 8,815,143 B2 | 8/2014 | John | |
| 8,902,497 B2 | 12/2014 | Erlandson | |
| 8,982,313 B2 | 3/2015 | Escuti | |
| 9,114,478 B2 | 8/2015 | Scott | |
| 9,136,668 B2 | 9/2015 | Bayramian | |
| 9,172,208 B1 | 10/2015 | Dawson | |
| 9,186,847 B2 | 11/2015 | Fruth | |
| 9,192,056 B2 | 11/2015 | Rubenchik | |
| 9,283,593 B2 | 3/2016 | Bruck | |
| 9,308,583 B2 | 4/2016 | El-dasher | |
| 9,331,452 B2 | 5/2016 | Bayramian | |
| 9,522,426 B2 | 12/2016 | Das | |
| 9,573,193 B2 | 2/2017 | Buller | |
| 9,815,139 B2 | 11/2017 | Bruck | |
| 9,855,625 B2 | 1/2018 | El-dasher | |
| 9,962,767 B2 | 5/2018 | Buller | |
| 10,011,079 B2 | 7/2018 | Wighton | |
| 10,099,430 B2 | 10/2018 | Dikovsky | |
| 10,155,345 B2 | 12/2018 | Ermoshkin | |
| 10,155,882 B2 | 12/2018 | Rolland | |
| 10,166,751 B2 | 1/2019 | Kramer | |
| 10,195,692 B2 | 2/2019 | Rockstroh | |
| 10,195,693 B2 | 2/2019 | Buller | |
| 10,226,919 B2 | 3/2019 | Ederer | |
| 10,279,598 B2 | 5/2019 | Deppe | |
| 10,328,685 B2 | 6/2019 | Jones | |
| 10,335,901 B2 | 7/2019 | Ferrar | |
| 2002/0015654 A1 | 2/2002 | Das | |
| 2002/0090313 A1 | 7/2002 | Wang | |
| 2002/0149137 A1 | 10/2002 | Jang | |
| 2003/0052105 A1 | 3/2003 | Nagano | |
| 2003/0178750 A1 | 9/2003 | Kulkarni | |
| 2004/0060639 A1* | 4/2004 | White | B23K 9/04 156/73.1 |
| 2004/0172164 A1* | 9/2004 | Habibi | G06T 1/0007 700/245 |
| 2005/0083498 A1 | 4/2005 | Jeng | |
| 2005/0131570 A1 | 6/2005 | Jamalabad | |
| 2006/0132732 A1 | 6/2006 | Kuit | |
| 2006/0192322 A1 | 8/2006 | Satoshi et al. | |
| 2007/0122560 A1 | 5/2007 | Adams | |
| 2008/0262659 A1 | 10/2008 | Huskamp | |
| 2009/0020901 A1 | 1/2009 | Schillen | |
| 2009/0177309 A1 | 7/2009 | Kozlak | |
| 2009/0206065 A1 | 8/2009 | Kruth | |
| 2009/0221422 A1 | 9/2009 | Miller | |
| 2010/0089881 A1 | 4/2010 | Bruland | |
| 2010/0176539 A1 | 7/2010 | Higashi | |
| 2010/0262272 A1 | 10/2010 | Shkolnik et al. | |
| 2011/0019705 A1 | 1/2011 | Adams | |
| 2011/0033887 A1 | 2/2011 | Fang | |
| 2011/0241947 A1 | 10/2011 | Scott et al. | |
| 2011/0278269 A1 | 11/2011 | Gold | |
| 2012/0039565 A1 | 2/2012 | Klein | |
| 2012/0113439 A1 | 5/2012 | Ederer | |
| 2013/0102447 A1 | 4/2013 | Strong | |
| 2013/0112672 A1 | 5/2013 | Keremes | |
| 2013/0136868 A1 | 5/2013 | Bruck | |
| 2013/0270750 A1 | 10/2013 | Green | |
| 2013/0271800 A1 | 10/2013 | Kanugo | |
| 2013/0300286 A1 | 11/2013 | Ljungblad | |
| 2013/0302533 A1 | 11/2013 | Bruck | |
| 2014/0085631 A1 | 3/2014 | Lacour | |
| 2014/0154088 A1 | 6/2014 | Etter | |
| 2014/0252687 A1 | 9/2014 | El-dasher | |
| 2014/0263209 A1 | 9/2014 | Burris | |
| 2014/0271965 A1 | 9/2014 | Ferrar | |
| 2014/0367894 A1 | 12/2014 | Kramer | |
| 2015/0066178 A1 | 3/2015 | Stava | |
| 2015/0076732 A1* | 3/2015 | Kemmer | B29C 64/106 264/255 |
| 2015/0096266 A1 | 4/2015 | Divine | |
| 2015/0132173 A1 | 5/2015 | Bruck | |
| 2015/0165556 A1 | 6/2015 | Jones | |
| 2015/0211083 A1 | 7/2015 | Gabilondo | |
| 2015/0273632 A1 | 10/2015 | Chen | |
| 2015/0283612 A1 | 10/2015 | Maeda | |
| 2015/0283614 A1 | 10/2015 | Wu | |
| 2015/0311064 A1 | 10/2015 | Stuart | |
| 2015/0343664 A1 | 12/2015 | Liu | |
| 2015/0360418 A1 | 12/2015 | Shah | |
| 2015/0375456 A1 | 12/2015 | Cheverton | |
| 2016/0067923 A1 | 3/2016 | James | |
| 2016/0082662 A1 | 3/2016 | Majer | |
| 2016/0114432 A1 | 4/2016 | Ferrar | |
| 2016/0175935 A1 | 6/2016 | Ladewig | |
| 2016/0236279 A1 | 8/2016 | Ashton | |
| 2016/0243652 A1 | 8/2016 | El-dasher | |

(56) References Cited

U.S. PATENT DOCUMENTS

| | | |
|---|---|---|
| 2016/0263822 A1 | 9/2016 | Boyd, IV |
| 2016/0279707 A1 | 9/2016 | Mattes |
| 2016/0322777 A1 | 11/2016 | Zediker |
| 2017/0036783 A1 | 2/2017 | Snyder |

FOREIGN PATENT DOCUMENTS

| | | | |
|---|---|---|---|
| DE | 102013205029 A1 | 9/2014 | |
| EP | 0402944 A2 | 12/1990 | |
| EP | 2666613 A1 | 11/2013 | |
| EP | 2875897 A1 | 5/2015 | |
| EP | 2910362 A1 | 8/2015 | |
| EP | 2926979 A1 | 10/2015 | |
| EP | 2964418 B1 | 5/2019 | |
| GB | 2453945 A | 4/2009 | |
| JP | 5933512 B2 | 6/2016 | |
| WO | WO-2009010034 A2 * | 1/2009 | ............ C22C 29/06 |
| WO | WO/2012/131481 A1 | 10/2012 | |
| WO | WO/2012/151262 A2 | 11/2012 | |
| WO | WO/2014/199134 A1 | 12/2014 | |
| WO | WO/2014/199149 A1 | 12/2014 | |
| WO | WO/2014/074954 A3 | 1/2015 | |
| WO | WO/2015/003804 A1 | 1/2015 | |
| WO | WO/2015/017077 A1 | 2/2015 | |
| WO | WO/2015/108991 A2 | 7/2015 | |
| WO | WO/2015/120168 A1 | 8/2015 | |
| WO | WO/2015/191257 A1 | 12/2015 | |
| WO | WO/2015/134075 A3 | 1/2016 | |
| WO | WO/2016/071265 A1 | 5/2016 | |
| WO | WO/2016/079496 A3 | 6/2016 | |
| WO | WO/2016/110440 A1 | 7/2016 | |
| WO | WO/2016/201309 A1 | 12/2016 | |
| WO | WO/2018/087218 A1 | 5/2018 | |

* cited by examiner

PART MANIPULATION USING PRINTED MANIPULATION POINTS

CROSS-REFERENCE TO RELATED PATENT APPLICATION

The present disclosure is part of a non-provisional patent application claiming the priority benefit of
U.S. Patent Application No. 62/248,758, filed on Oct. 30, 2015,
U.S. Patent Application No. 62/248,765, filed on Oct. 30, 2015,
U.S. Patent Application No. 62/248,770, filed on Oct. 30, 2015,
U.S. Patent Application No. 62/248,776, filed on Oct. 30, 2015,
U.S. Patent Application No. 62/248,783, filed on Oct. 30, 2015,
U.S. Patent Application No. 62/248,791, filed on Oct. 30, 2015,
U.S. Patent Application No. 62/248,799, filed on Oct. 30, 2015,
U.S. Patent Application No. 62/248,966, filed on Oct. 30, 2015,
U.S. Patent Application No. 62/248,968, filed on Oct. 30, 2015,
U.S. Patent Application No. 62/248,969, filed on Oct. 30, 2015,
U.S. Patent Application No. 62/248,980, filed on Oct. 30, 2015,
U.S. Patent Application No. 62/248,989, filed on Oct. 30, 2015,
U.S. Patent Application No. 62/248,780, filed on Oct. 30, 2015,
U.S. Patent Application No. 62/248,787, filed on Oct. 30, 2015,
U.S. Patent Application No. 62/248,795, filed on Oct. 30, 2015,
U.S. Patent Application No. 62/248,821, filed on Oct. 30, 2015,
U.S. Patent Application No. 62/248,829, filed on Oct. 30, 2015,
U.S. Patent Application No. 62/248,833, filed on Oct. 30, 2015,
U.S. Patent Application No. 62/248,835, filed on Oct. 30, 2015,
U.S. Patent Application No. 62/248,839, filed on Oct. 30, 2015,
U.S. Patent Application No. 62/248,841, filed on Oct. 30, 2015,
U.S. Patent Application No. 62/248,847, filed on Oct. 30, 2015, and
U.S. Patent Application No. 62/248,848, filed on Oct. 30, 2015, which are incorporated by reference in its entirety.

TECHNICAL FIELD

The present disclosure relates generally to a system and method for the manipulation of parts in an additive manufacturing systems. In some embodiments, a robotic or other mechanical mechanism can interface with permanent or temporary manipulator points defined in, or associated with, the part.

BACKGROUND

Automated or robotic manipulation methods are being increasingly used in manufacturing and industry. A wide variety of automated manipulators with various articulation and degrees of motion are available. Such manipulators can include simple Cartesian x-y-z translations using linear slides, SCARA (Selective Compliance Articulated Robot Arm) able to do x-y-z and rotational movements, or articulated manipulators with six degrees of freedom or more. Automated manipulators can operate continuously for long durations of time, in hostile environmental conditions, and with precision and weight handling ability that is difficult or impossible for human workers to match.

Another technique increasingly used in manufacturing and industry is known as additive manufacturing. Additive manufacturing, also referred to as 3D printing, typically involves sequential layer by layer addition of material to build a part. Beginning with a 3D computer model, an additive manufacturing system can be used to create complex parts from a wide variety of materials. One additive manufacturing technique known as powder bed fusion (PBF) uses one or more focused energy sources, such as a laser or electron beam, to draw a pattern in a thin layer of powder by melting the powder and bonding it to the layer below.

DETAILED DESCRIPTION

Figure 1A:
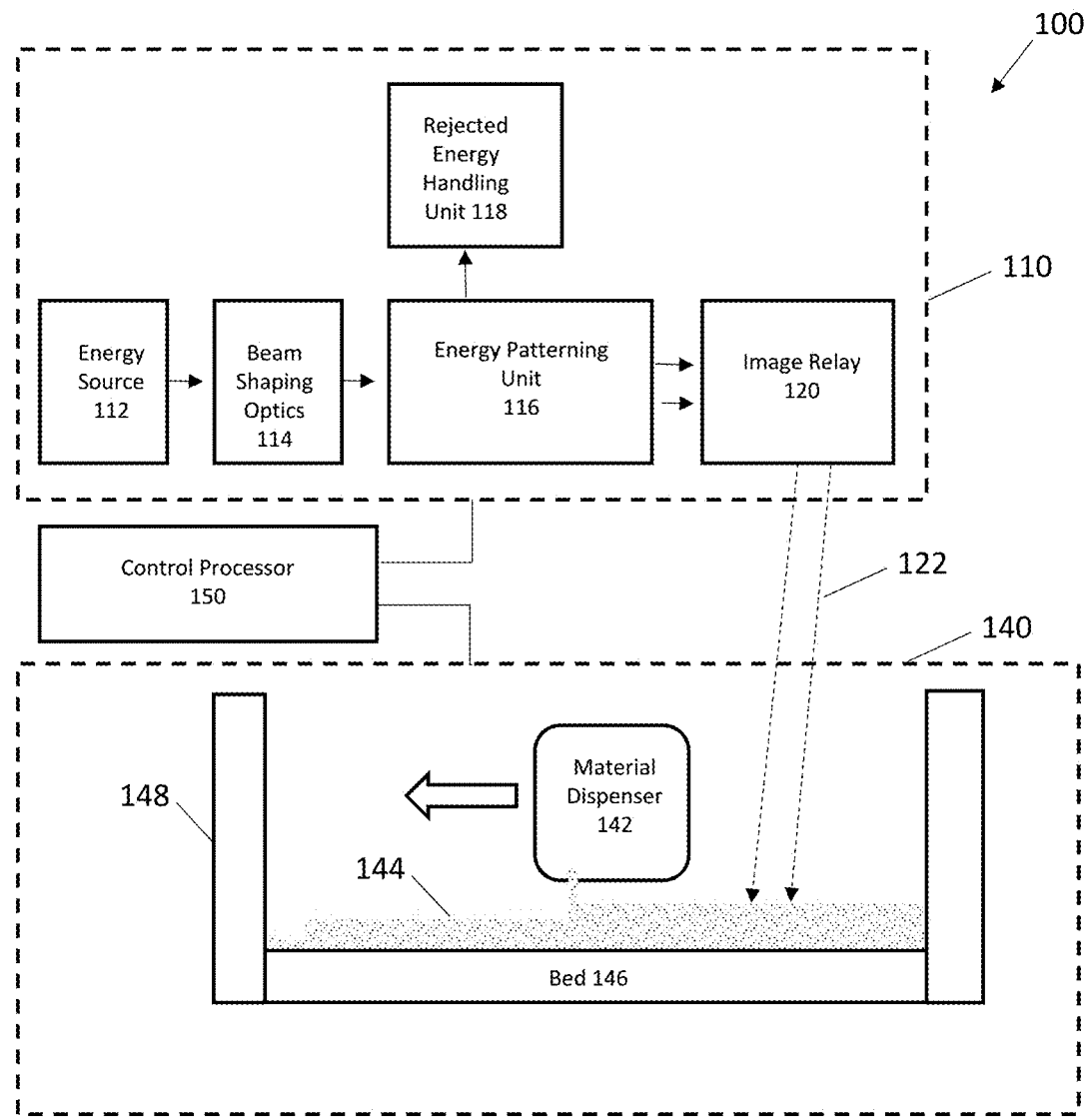
FIG. 1A illustrates an additive manufacturing system.

In the following description, reference is made to the accompanying drawings that form a part thereof, and in which is shown by way of illustrating specific exemplary embodiments in which the disclosure may be practiced.

These embodiments are described in sufficient detail to enable those skilled in the art to practice the concepts disclosed herein, and it is to be understood that modifications to the various disclosed embodiments may be made, and other embodiments may be utilized, without departing from the scope of the present disclosure. The following detailed description is, therefore, not to be taken in a limiting sense.

An additive manufacturing system that supports or accommodates use of various features and elements to enable manufacture various parts, components, structures, frames, trusses, lattices, columns, tubes, beams, airfoils, blades, propellers, and the like is discussed in the following. Such structures, components, or complete units (collectively described herein as "parts") can be formed from at least one of a metal, metal hybrid material, ceramic, ceramic hybrid material, glass, glass hybrid material, plastic, plastic hybrid material, or other material or combination of materials that are capable of melting; and substantially formed using only an additive manufacturing system. These parts can include temporary or permanent structures, also additively manufactured, that can act as manipulation points. Such structures can include but are not limited to, sprues, lips, extensions, pads, notches, gaps, cavities, lands, or the like. In some embodiments, optical or imaging sensors can be used to identify guide or indicial marks defined on the part or a manipulation point to allow for precise three-dimensional location of the part. In certain embodiments, the additive manufacturing system has an energy source that can support multiple energy beams, and an energy patterning unit that can include a transmissive or reflective optically addressed light valve to allow high throughput processing that can be aided by use of a robot arm.

In certain embodiments discussed herein, increasing throughput of manufactured parts using additive manufacturing techniques can benefit from use of automated manipulation technology. The disclosed manufacturing method can include the steps of providing a powdered material; providing an energy source that can include multiple semiconductor lasers; and directing a beam from the energy source toward an energy patterning unit. The energy patterning unit can include an optically addressed light valve or other patterning mechanism to form a two-dimensional patterned energy beam, which is directed against the powder material to form a part having a printed manipulation point. To improve processing flexibility and manufacturing throughput, an automated manipulator can be used to engage the manipulation point. In some embodiments, further processing steps could include removing the manipulation point, mechanically or with a directed energy beam. In another embodiment the part can be reoriented within a powder chamber using the automated manipulator before adding more powdered material. Alternatively, or in addition, the part having a manipulation point can be moved to another processing area by the automatic manipulator.

Parts can include additively printed structures formed from at least one of a metal, ceramic, or metallo-ceramic material. The parts can be substantially formed using only an additive manufacturing system that includes a two-dimensional patterned energy beam. The parts further have one or more manipulation points capable of being engaged by a manipulator device. The manipulation points can be structures projecting from the part or structures defined within the part, including cavities, notches, lands, or holes. In those embodiments with projecting parts, the manipulation point can be a temporary structure removable with, for example, a mechanical clipper or directed energy beam.

Another described embodiment is a method of manufacturing a part by providing a powder material selected from at least one of a metal, ceramic, or metallo-ceramic material. A part is substantially additively manufactured to have a manipulation point, with the part being movable using a manipulator to engage the manipulation point. In some embodiments, additive manufacturing can involve use of an energy source that includes multiple lasers. The lasers collectively form a beam directed from the energy source toward an energy patterning unit that includes an optically addressed light valve, forming a two-dimensional patterned energy beam. This two-dimensional patterned energy beam is directed against the powder material to form the part with the defined manipulation point.

As seen in FIG. 1, an additive manufacturing system 100 has an energy patterning system 110 with an energy source 112 that can direct one or more continuous or intermittent energy beam(s) toward beam shaping optics 114. After shaping, if necessary, the beam is patterned by an energy patterning unit 116, with generally some energy being directed to a rejected energy handling unit 118. Patterned energy is relayed by image relay 120 toward an article processing unit 140, typically as a two-dimensional image 122 focused near a bed 146. The bed 146 (with optional walls 148) can form a chamber containing material 144 dispensed by material dispenser 142. Patterned energy, directed by the image relay 120, can melt, fuse, sinter, amalgamate, change crystal structure, influence stress patterns, or otherwise chemically or physically modify the dispensed material 144 to form structures with desired properties.

Energy source 112 generates photon (light), electron, ion, or other suitable energy beams or fluxes capable of being directed, shaped, and patterned. Multiple energy sources can be used in combination. The energy source 112 can include lasers, incandescent light, concentrated solar, other light sources, electron beams, or ion beams. Possible laser types include, but are not limited to: Gas Lasers, Chemical Lasers, Dye Lasers, Metal Vapor Lasers, Solid State Lasers (e.g. fiber), Semiconductor (e.g. diode) Lasers, Free electron laser, Gas dynamic laser, "Nickel-like" Samarium laser, Raman laser, or Nuclear pumped laser.

A Gas Laser can include lasers such as a Helium-neon laser, Argon laser, Krypton laser, Xenon ion laser, Nitrogen laser, Carbon dioxide laser, Carbon monoxide laser or Excimer laser.

A Chemical laser can include lasers such as a Hydrogen fluoride laser, Deuterium fluoride laser, COIL (Chemical oxygen-iodine laser), or Agil (All gas-phase iodine laser).

A Metal Vapor Laser can include lasers such as a Helium-cadmium (HeCd) metal-vapor laser, Helium-mercury (HeHg) metal-vapor laser, Helium-selenium (HeSe) metal-vapor laser, Helium-silver (HeAg) metal-vapor laser, Strontium Vapor Laser, Neon-copper (NeCu) metal-vapor laser, Copper vapor laser, Gold vapor laser, or Manganese (Mn/MnCl$_2$) vapor laser.

a. A Solid State Laser can include lasers such as a Ruby laser, Nd:YAG laser, NdCrYAG laser, Er:YAG laser, Neodymium YLF (Nd:YLF) solid-state laser, Neodymium doped Yttrium orthovanadate(Nd:YVO$_4$) laser, Neodymium doped yttrium calcium oxoborateNd:YCa$_4$O(BO$_3$)$^3$ or simply Nd:YCOB, Neodymium glass(Nd:Glass) laser, Titanium sapphire(Ti:sapphire) laser, Thulium YAG (Tm:YAG) laser, Ytterbium YAG (Yb:YAG) laser, Ytterbium:2O$_3$ (glass or ceramics) laser, Ytterbium doped glass laser (rod, plate/chip, and fiber), Holmium YAG (Ho:YAG) laser, Chromium ZnSe (Cr:ZnSe) laser, Cerium doped lithium strontium (or calcium)aluminum fluoride(Ce:LiSAF, Ce:LiCAF), Promethium 147 doped phosphate glass(147Pm$^{+3}$:Glass) solid-state laser, Chromium doped chrysoberyl (alexandrite) laser, Erbium doped anderbium-ytterbium co-doped glass lasers, Trivalent uranium doped calcium fluoride (U:CaF$_2$) solid-state laser, Divalent samarium doped calcium fluoride(Sm:CaF$_2$) laser, or F-Center laser.

A Semiconductor Laser can include laser medium types such as GaN, InGaN, AlGaInP, AlGaAs, InGaAsP, GaInP, InGaAs, InGaAsO, GaInAsSb, lead salt, Vertical cavity surface emitting laser (VCSEL), Quantum cascade laser, Hybrid silicon laser, or combinations thereof.

For example, in one embodiment a single Nd:YAG q-switched laser can be used in conjunction with multiple semiconductor lasers. In another embodiment, an electron beam can be used in conjunction with an ultraviolet semiconductor laser array. In still other embodiments, a two-dimensional array of lasers can be used. In some embodiments with multiple energy sources, pre-patterning of an energy beam can be done by selectively activating and deactivating energy sources.

Beam shaping unit 114 can include a great variety of imaging optics to combine, focus, diverge, reflect, refract, homogenize, adjust intensity, adjust frequency, or otherwise shape and direct one or more energy beams received from the energy source 112 toward the energy patterning unit 116. In one embodiment, multiple light beams, each having a distinct light wavelength, can be combined using wavelength selective mirrors (e.g. dichroics) or diffractive elements. In other embodiments, multiple beams can be homogenized or combined using multifaceted mirrors, microlenses, and refractive or diffractive optical elements.

Energy patterning unit 116 can include static or dynamic energy patterning elements. For example, photon, electron, or ion beams can be blocked by masks with fixed or movable elements. To increase flexibility and ease of image patterning, pixel addressable masking, image generation, or transmission can be used. In some embodiments, the energy patterning unit includes addressable light valves, alone or in conjunction with other patterning mechanisms to provide patterning. The light valves can be transmissive, reflective, or use a combination of transmissive and reflective elements. Patterns can be dynamically modified using electrical or optical addressing. In one embodiment, a transmissive optically addressed light valve acts to rotate polarization of light passing through the valve, with optically addressed pixels forming patterns defined by a light projection source. In another embodiment, a reflective optically addressed light valve includes a write beam for modifying polarization of a read beam. In yet another embodiment, an electron patterning device receives an address pattern from an electrical or photon stimulation source and generates a patterned emission of electrons.

Rejected energy handling unit 118 is used to disperse, redirect, or utilize energy not patterned and passed through the energy pattern image relay 120. In one embodiment, the rejected energy handling unit 118 can include passive or active cooling elements that remove heat from the energy patterning unit 116. In other embodiments, the rejected energy handling unit can include a "beam dump" to absorb and convert to heat any beam energy not used in defining the energy pattern. In still other embodiments, rejected beam energy can be recycled using beam shaping optics 114. Alternatively, or in addition, rejected beam energy can be directed to the article processing unit 140 for heating or further patterning. In certain embodiments, rejected beam energy can be directed to additional energy patterning systems or article processing units.

Image relay 120 receives a patterned image (typically two-dimensional) from the energy patterning unit 116 and guides it toward the article processing unit 140. In a manner similar to beam shaping optics 114, the image relay 120 can include optics to combine, focus, diverge, reflect, refract, adjust intensity, adjust frequency, or otherwise shape and direct the patterned image.

Article processing unit 140 can include a walled chamber 148 and bed 144, and a material dispenser 142 for distributing material. The material dispenser 142 can distribute, remove, mix, provide gradations or changes in material type or particle size, or adjust layer thickness of material. The material can include metal, ceramic, glass, polymeric powders, other melt-able material capable of undergoing a thermally induced phase change from solid to liquid and back again, or combinations thereof. The material can further include composites of melt-able material and non-melt-able material where either or both components can be selectively targeted by the imaging relay system to melt the component that is melt-able, while either leaving along the non-melt-able material or causing it to undergo a vaporizing/destroying/combusting or otherwise destructive process. In certain embodiments, slurries, sprays, coatings, wires, strips, or sheets of materials can be used. Unwanted material can be removed for disposable or recycling by use of blowers, vacuum systems, sweeping, vibrating, shaking, tipping, or inversion of the bed 146.

In addition to material handling components, the article processing unit 140 can include components for holding and supporting 3D structures, mechanisms for heating or cooling the chamber, auxiliary or supporting optics, and sensors and control mechanisms for monitoring or adjusting material or environmental conditions. The article processing unit can, in whole or in part, support a vacuum or inert gas atmosphere to reduce unwanted chemical interactions as well as to mitigate the risks of fire or explosion (especially with reactive metals).

Control processor 150 can be connected to control any components of additive manufacturing system 100. The control processor 150 can be connected to variety of sensors, actuators, heating or cooling systems, monitors, and controllers to coordinate operation. A wide range of sensors, including imagers, light intensity monitors, thermal, pressure, or gas sensors can be used to provide information used in control or monitoring. The control processor can be a single central controller, or alternatively, can include one or more independent control systems. The controller processor 150 is provided with an interface to allow input of manufacturing instructions. Use of a wide range of sensors allows various feedback control mechanisms that improve quality, manufacturing throughput, and energy efficiency.

Figure 1B:
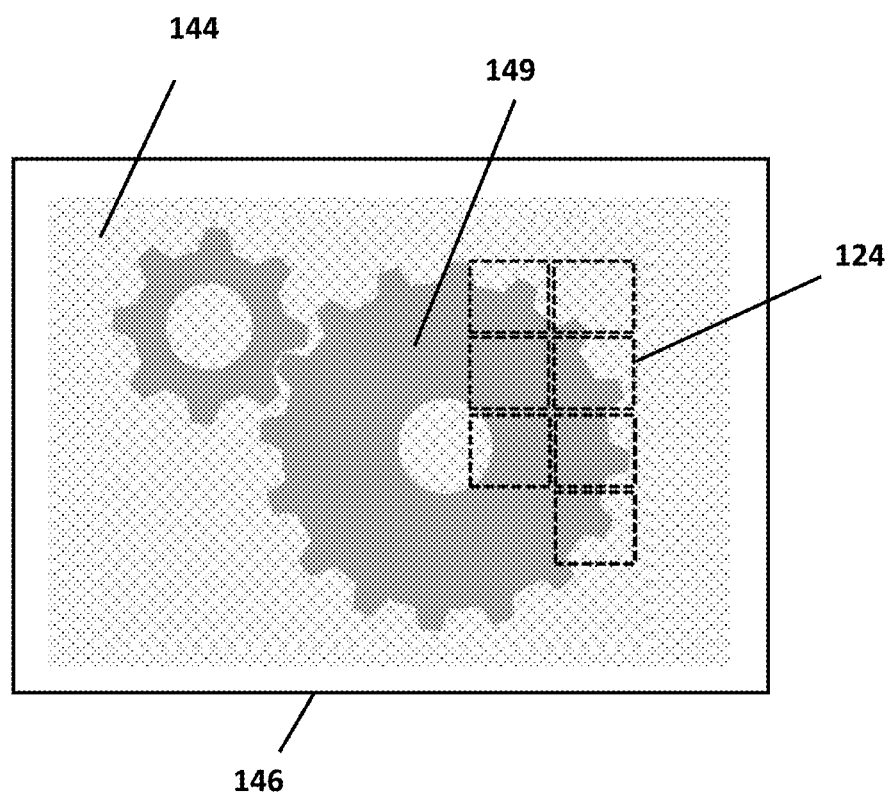
FIG. 1B is a top view of a structure being formed on an additive manufacturing system.

FIG. 1B is a cartoon illustrating a bed 146 that supports material 144. Using a series of sequentially applied, two-dimensional patterned energy beam images (squares in dotted outline 124), a structure 149 is additively manufactured. As will be understood, image patterns having non-square boundaries can be used, overlapping or interpenetrating images can be used, and images can be provided by two or more energy patterning systems. In other embodiments, images can be formed in conjunction with directed electron or ion beams, or with printed or selective spray systems.

Figure 2:
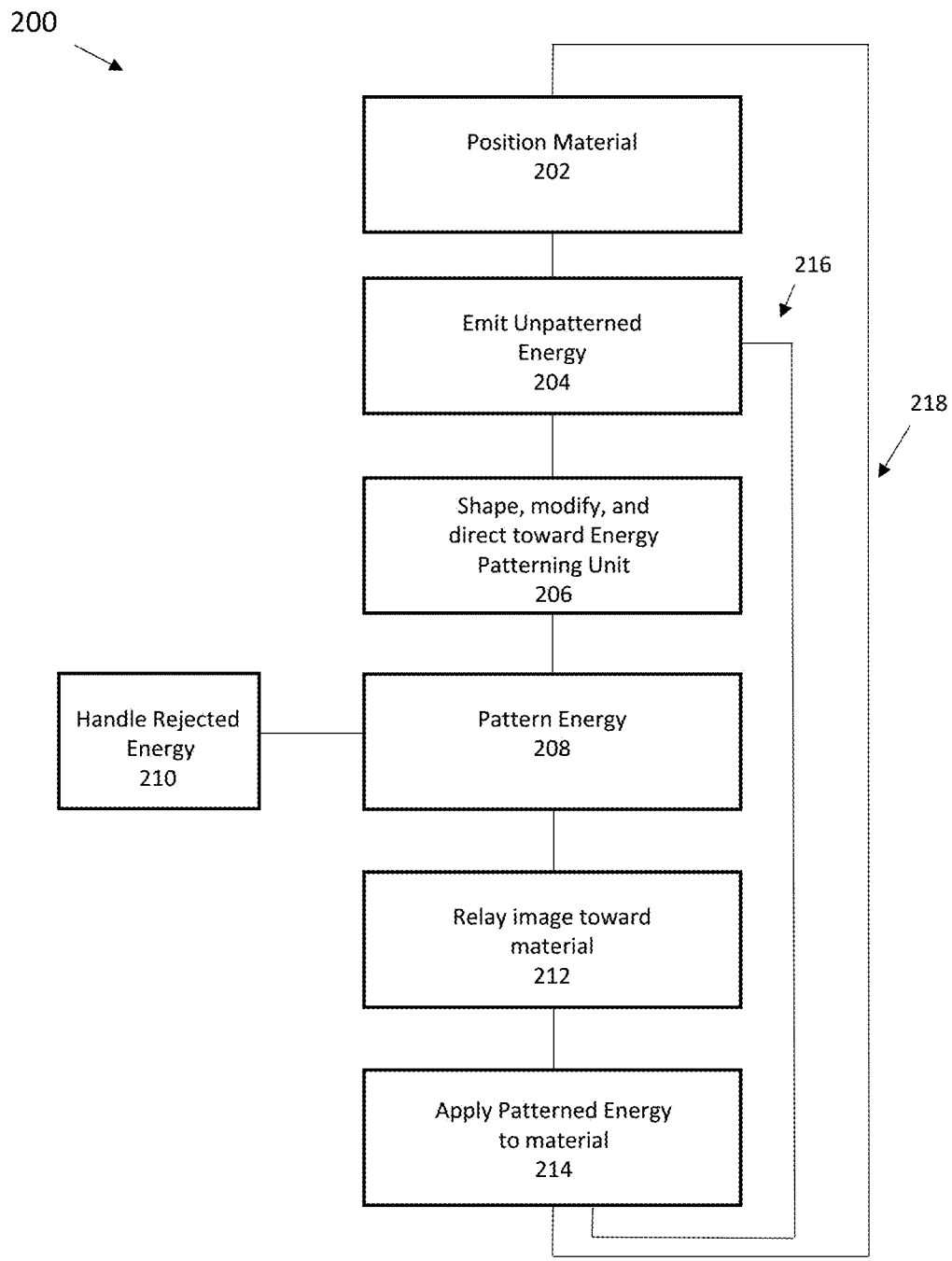
FIG. 2 illustrates an additive manufacturing method.

FIG. 2 is a flow chart illustrating one embodiment of an additive manufacturing process supported by the described optical and mechanical components. In step 202, material is positioned in a bed, chamber, or other suitable support. The material can be a powder capable of being melted, fused, sintered, induced to change crystal structure, have stress patterns influenced, or otherwise chemically or physically modified to form structures with desired properties.

In step 204, unpatterned energy is emitted by one or more energy emitters, including but not limited to solid state or semiconductor lasers, or electrical power supply flowing electrons down a wire. In step 206, the unpatterned energy is shaped and modified (e.g. intensity modulated or focused). In step 208, this unpatterned energy is patterned, with energy not forming a part of the pattern being handled in step 210 (this can include conversion to waste heat, or recycling as patterned or unpatterned energy). In step 212, the patterned energy, now forming a two-dimensional image is relayed toward the material. In step 214, the image is applied to the material, building a portion of a 3D structure. These steps can be repeated (loop 218) until the image (or different and subsequent image) has been applied to all necessary regions of a top layer of the material. When application of energy to the top layer of the material is finished, a new layer can be applied (loop 216) to continue building the 3D structure. These process loops are continued until the 3D structure is complete, when remaining excess material can be removed or recycled.

Figure 3A:
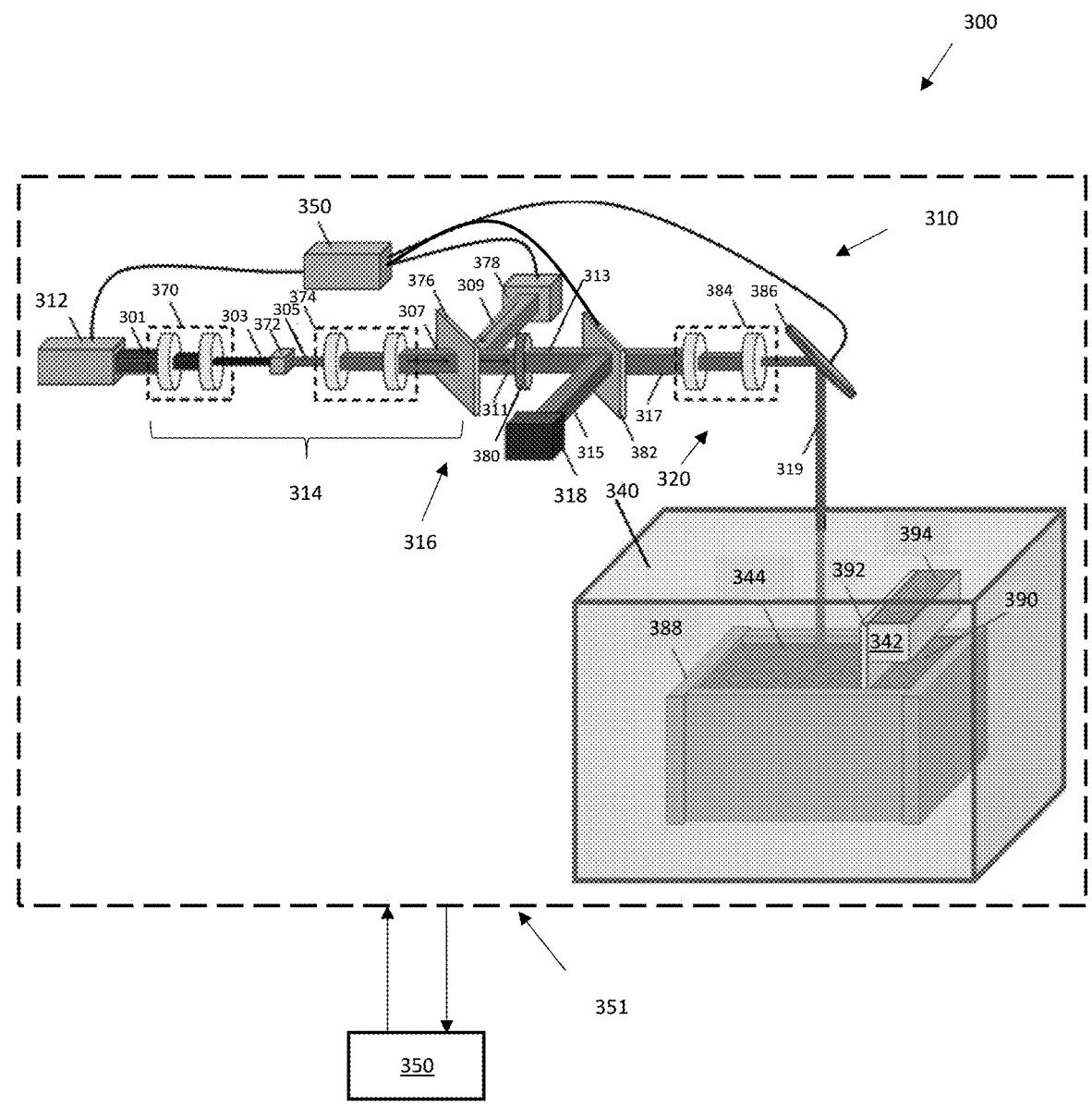
FIG. 3A is a cartoon illustrating an additive manufacturing system including lasers.

FIG. 3A is one embodiment of an additive manufacturing system 300 that uses multiple semiconductor lasers as part of an energy patterning system 310. A control processor 350 can be connected to variety of sensors, actuators, heating or cooling systems, monitors, and controllers to coordinate operation of multiple lasers 312, light patterning unit 316, and image relay 320, as well as any other component of system 300. These connections are generally indicated by a dotted outline 351 surrounding components of system 300. As will be appreciated, connections can be wired or wireless, continuous or intermittent, and include capability for feedback (for example, thermal heating can be adjusted in response to sensed temperature). The multiple lasers 312 can emit a beam 301 of light at a 1000 nm wavelength that, for example, is 90 mm wide by 20 mm tall. The beam 301 is resized by imaging optics 370 to create beam 303. Beam 303 is 6 mm wide by 6 mm tall, and is incident on light homogenization device 372 which blends light together to create blended beam 305. Beam 305 is then incident on imaging assembly 374 which reshapes the light into beam 307 and is then incident on hot cold mirror 376. The mirror 376 allows 1000 nm light to pass, but reflects 450 nm light. A light projector 378 capable of projecting low power light at 1080p pixel resolution and 450 nm emits beam 309, which is then incident on hot cold mirror 376. Beams 307 and 309 overlay in beam 311, and both are imaged onto optically addressed light valve 380 in a 20 mm wide, 20 mm tall image. Images formed from the homogenizer 372 and the projector 378 are recreated and overlaid on light valve 380.

The optically addressed light valve 380 is stimulated by the light (typically ranging from 400-500 nm) and imprints a polarization rotation pattern in transmitted beam 313 which is incident upon polarizer 382. The polarizer 382 splits the two polarization states, transmitting p-polarization into beam 317 and reflecting s-polarization into beam 315 which is then sent to a beam dump 318 that handles the rejected energy. As will be understood, in other embodiments the polarization could be reversed, with s-polarization formed into beam 317 and reflecting p-polarization into beam 315. Beam 317 enters the final imaging assembly 320 which includes optics 384 that resize the patterned light. This beam reflects off of a movable mirror 386 to beam 319, which terminates in a focused image applied to material bed 344 in an article processing unit 340. The depth of field in the image selected to span multiple layers, providing optimum focus in the range of a few layers of error or offset.

The bed 390 can be raised or lowered (vertically indexed) within chamber walls 388 that contain material 344 dispensed by material dispenser 342. In certain embodiments, the bed 390 can remain fixed, and optics of the final imaging assembly 320 can be vertically raised or lowered. Material distribution is provided by a sweeper mechanism 392 that can evenly spread powder held in hopper 394, being able to provide new layers of material as needed. An image 6 mm wide by 6 mm tall can be sequentially directed by the movable mirror 386 at different positions of the bed.

When using a powdered ceramic or metal material in this additive manufacturing system 300, the powder can be spread in a thin layer, approximately 1-3 particles thick, on top of a base substrate (and subsequent layers) as the part is built. When the powder is melted, sintered, or fused by a patterned beam 319, it bonds to the underlying layer, creating a solid structure. The patterned beam 319 can be operated in a pulsed fashion at 40 Hz, moving to the subsequent 6 mm×6 mm image locations at intervals of 10 ms to 0.5 ms (with 3 to 0.1 ms being desirable) until the selected patterned areas of powder have been melted. The bed 390 then lowers itself by a thickness corresponding to one layer, and the sweeper mechanism 392 spreads a new layer of powdered material. This process is repeated until the 2D layers have built up the desired 3D structure. In certain embodiments, the article processing unit 340 can have a controlled atmosphere. This allows reactive materials to be manufactured in an inert gas, or vacuum environment without the risk of oxidation or chemical reaction, or fire or explosion (if reactive metals are used).

Figure 3B:
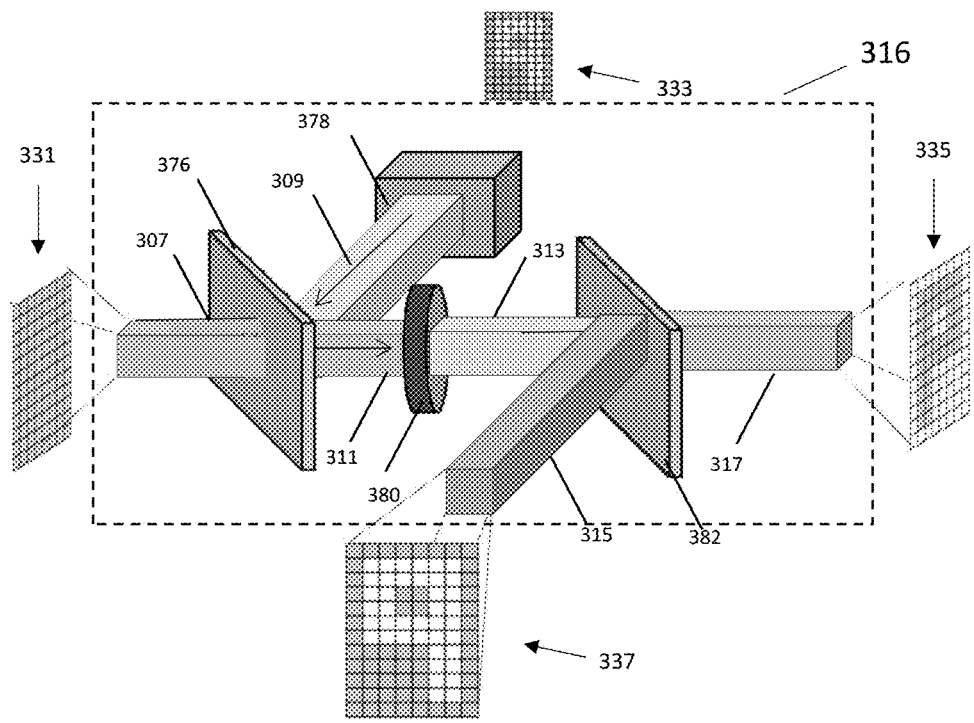
FIG. 3B is a detailed description of the light patterning unit shown in FIG. 3A.

FIG. 3B illustrates in more detail operation of the light patterning unit 316 of FIG. 3A. As seen in FIG. 3B, a representative input pattern 333 (here seen as the numeral "9") is defined in an 8×12 pixel array of light projected as beam 309 toward mirror 376. Each grey pixel represents a light filled pixel, while white pixels are unlit. In practice, each pixel can have varying levels of light, including light-free, partial light intensity, or maximal light intensity. Unpatterned light 331 that forms beam 307 is directed and passes through a hot/cold mirror 376, where it combines with patterned beam 309. After reflection by the hot/cold mirror 376, the patterned light beam 311 formed from overlay of beams 307 and 309 in beam 311, and both are imaged onto optically addressed light valve 380. The optically addressed light valve 380, which would rotate the polarization state of unpatterned light 331, is stimulated by the patterned light beam 309, 311 to selectively not rotate the polarization state of polarized light 307, 311 in the pattern of the numeral "9" into beam 313. The unrotated light representative of pattern 333 in beam 313 is then allowed to pass through polarizer mirror 382 resulting in beam 317 and pattern 335. Polarized light in a second rotated state is rejected by polarizer mirror 382, into beam 315 carrying the negative pixel pattern 337 consisting of a light-free numeral "9".

Other types of light valves can be substituted or used in combination with the described light valve. Reflective light valves, or light valves base on selective diffraction or refraction can also be used. In certain embodiments, non-optically addressed light valves can be used. These can include but are not limited to electrically addressable pixel elements, movable mirror or micro-mirror systems, piezo or micro-actuated optical systems, fixed or movable masks, or shields, or any other conventional system able to provide high intensity light patterning. For electron beam patterning, these valves may selectively emit electrons based on an address location, thus imbuing a pattern on the beam of electrons leaving the valve.

Figure 3C:
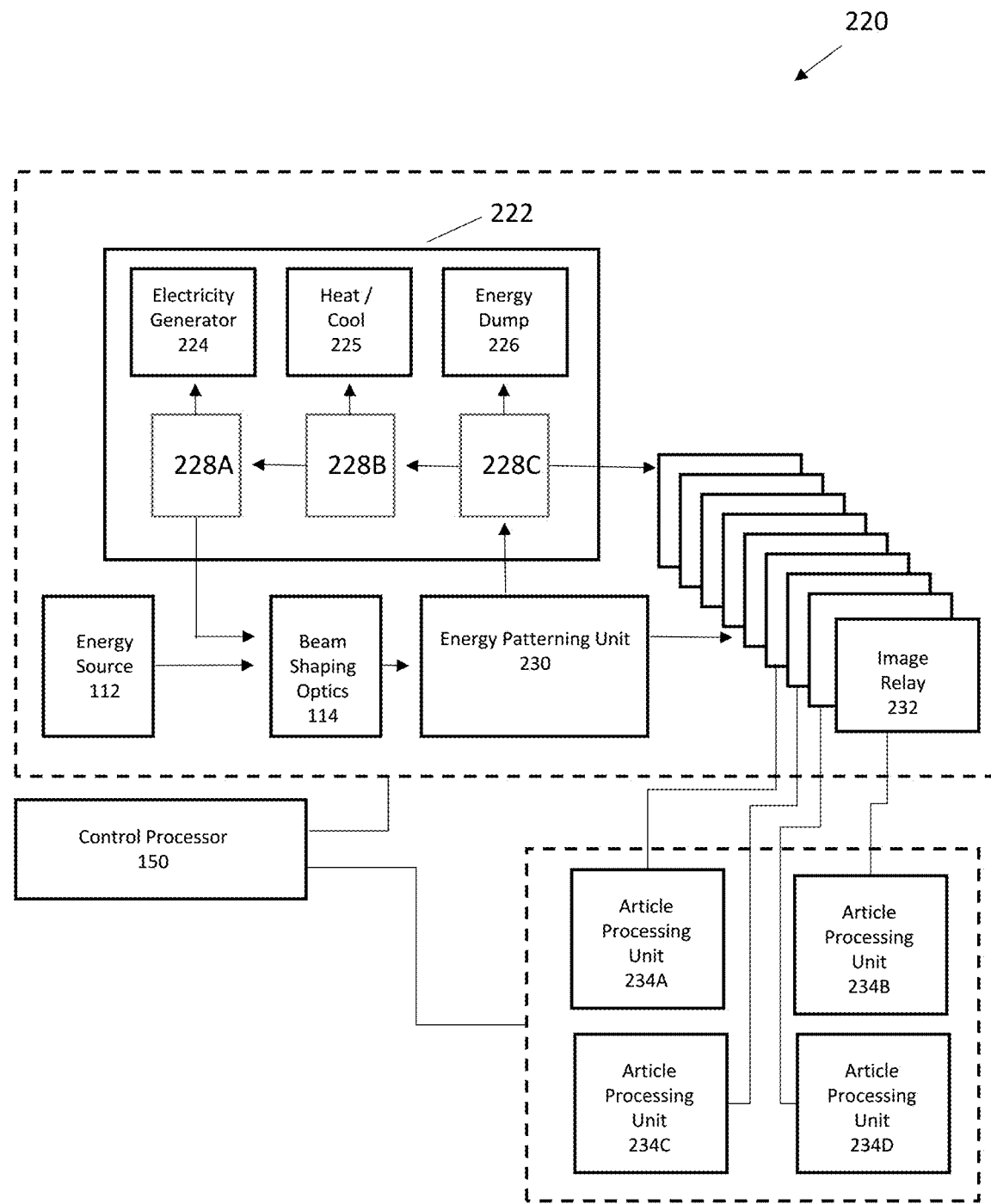
FIG. 3C is one embodiment of an additive manufacturing system with a "switchyard" for directing and repatterning light using multiple image relays.

FIG. 3C is one embodiment of an additive manufacturing system that includes a switchyard system enabling reuse of patterned two-dimensional energy. Similar to the embodiment discussed with respect to FIG. 1A, an additive manufacturing system 220 has an energy patterning system with an energy source 112 that directs one or more continuous or intermittent energy beam(s) toward beam shaping optics 114. After shaping, the beam is two-dimensionally patterned by an energy patterning unit 230, with generally some energy being directed to a rejected energy handling unit 222. Patterned energy is relayed by one of multiple image relays 232 toward one or more article processing units 234A, 234B, 234C, or 234D, typically as a two-dimensional image focused near a movable or fixed height bed. The bed (with optional walls) can form a chamber containing material dispensed by material dispenser. Patterned energy, directed by the image relays 232, can melt, fuse, sinter, amalgamate, change crystal structure, influence stress patterns, or otherwise chemically or physically modify the dispensed material to form structures with desired properties.

In this embodiment, the rejected energy handling unit has multiple components to permit reuse of rejected patterned energy. Relays 228A, 228B, and 22C can respectively transfer energy to an electricity generator 224, a heat/cool thermal management system 225, or an energy dump 226. Optionally, relay 228C can direct patterned energy into the image relay 232 for further processing. In other embodiments, patterned energy can be directed by relay 228C, to relay 228B and 228A for insertion into the energy beam(s) provided by energy source 112. Reuse of patterned images is also possible using image relay 232. Images can be redirected, inverted, mirrored, sub-patterned, or otherwise transformed for distribution to one or more article processing units. 234A-D. Advantageously, reuse of the patterned light can improve energy efficiency of the additive manufacturing process, and in some cases improve energy intensity directed at a bed, or reduce manufacture time.

Figure 3D:
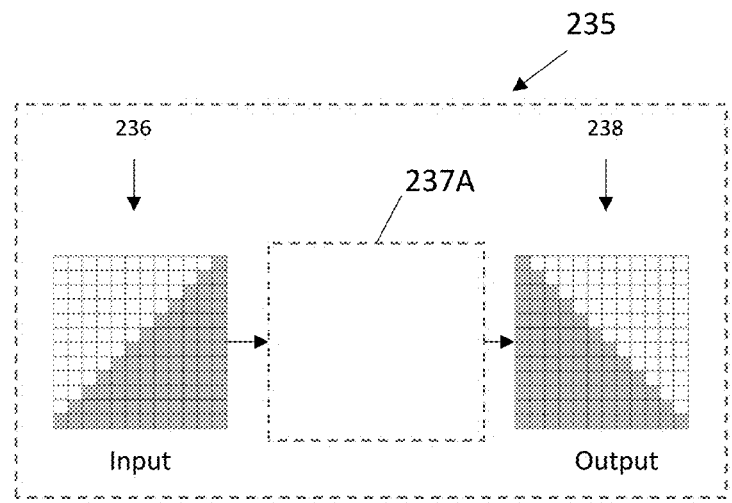
FIG. 3D illustrates a simple mirror image pixel remapping.

FIG. 3D is a cartoon 235 illustrating a simple geometrical transformation of a rejected energy beam for reuse. An input pattern 236 is directed into an image relay 237 capable of providing a mirror image pixel pattern 238. As will be appreciated, more complex pixel transformations are possible, including geometrical transformations, or pattern remapping of individual pixels and groups of pixels. Instead of being wasted in a beam dump, this remapped pattern can be directed to an article processing unit to improve manufacturing throughput or beam intensity.

Figure 3E:
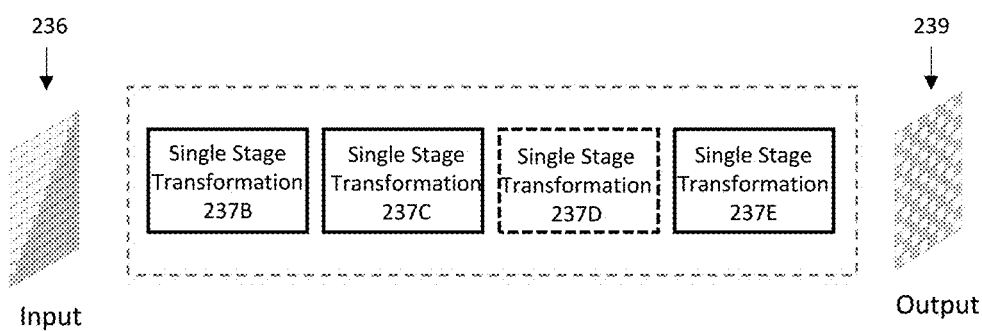
FIG. 3E illustrates a series of image transforming image relays for pixel remapping.

FIG. 3E is a cartoon 235 illustrating multiple transformations of a rejected energy beam for reuse. An input pattern 236 is directed into a series of image relays 237B-E capable of providing a pixel pattern 238.

Figure 3F:
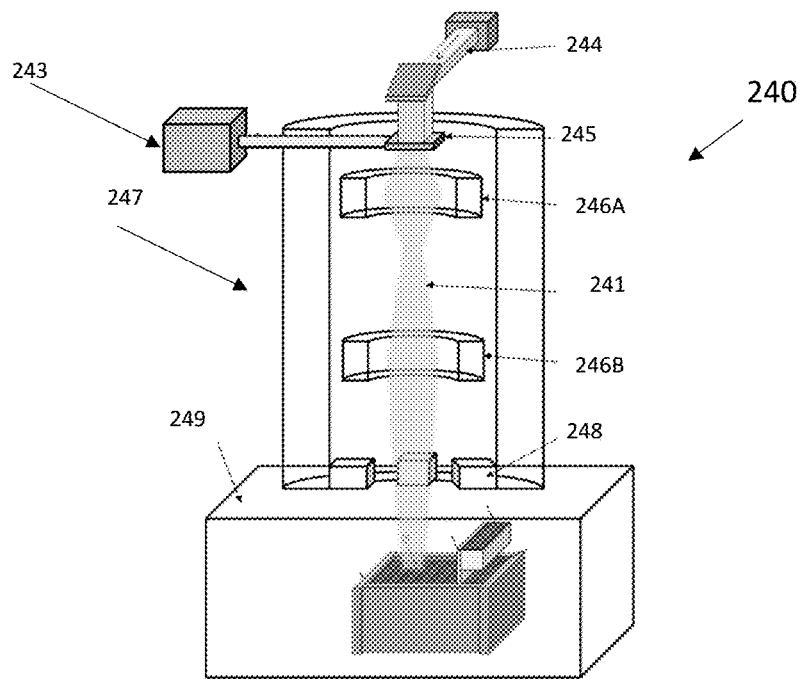
FIG. 3F illustrates an patternable electron energy beam additive manufacturing system.
Figure 3G:
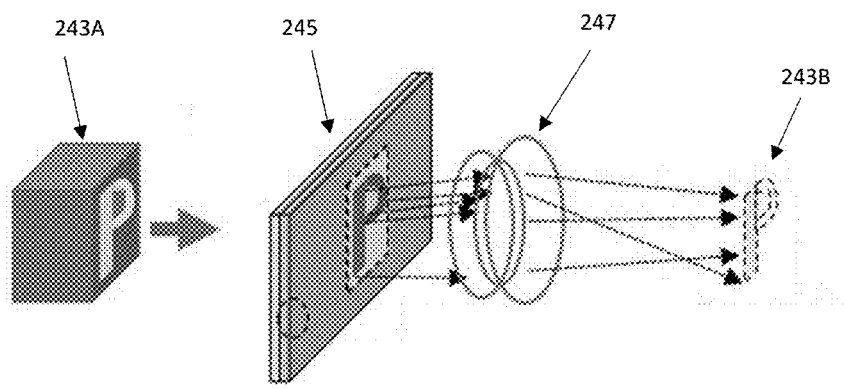
FIG. 3G illustrates a detailed description of the electron beam patterning unit shown in FIG. 3F.

FIGS. 3F and 3G illustrates a non-light based energy beam system 240 that includes a patterned electron beam 241 capable of producing, for example, a "P" shaped pixel image. A high voltage electricity power system 243 is connected to an optically addressable patterned cathode unit 245. In response to application of a two-dimensional patterned image by projector 244, the cathode unit 245 is stimulated to emit electrons wherever the patterned image is optically addressed. Focusing of the electron beam pattern is provided by an image relay system 247 that includes imaging coils 246A and 246B. Final positioning of the patterned image is provided by a deflection coil 248 that is able to move the patterned image to a desired position on a bed of additive manufacturing component 249.

In another embodiment supporting light recycling and reuse, multiplex multiple beams of light from one or more light sources are provided. The multiple beams of light may be reshaped and blended to provide a first beam of light. A spatial polarization pattern may be applied on the first beam of light to provide a second beam of light. Polarization states of the second beam of light may be split to reflect a third beam of light, which may be reshaped into a fourth beam of light. The fourth beam of light may be introduced as one of the multiple beams of light to result in a fifth beam of light. In effect, this or similar systems can reduce energy costs associated with an additive manufacturing system. By collecting, beam combining, homogenizing and re-introducing unwanted light rejected by a spatial polarization valve or light valve operating in polarization modification mode, overall transmitted light power can potentially be unaffected by the pattern applied by a light valve. This advantageously results in an effective re-distribution of the light passing through the light valve into the desired pattern, increasing the light intensity proportional to the amount of area patterned.

Combining beams from multiple lasers into a single beam is one way to increasing beam intensity. In one embodiment, multiple light beams, each having a distinct light wavelength, can be combined using either wavelength selective mirrors or diffractive elements. In certain embodiments, reflective optical elements that are not sensitive to wavelength dependent refractive effects can be used to guide a multiwavelength beam.

Patterned light can be directed using movable mirrors, prisms, diffractive optical elements, or solid state optical systems that do not require substantial physical movement. In one embodiment, a magnification ratio and an image distance associated with an intensity and a pixel size of an incident light on a location of a top surface of a powder bed can be determined for an additively manufactured, three-dimensional (3D) print job. One of a plurality of lens assemblies can be configured to provide the incident light having the magnification ratio, with the lens assemblies both a first set of optical lenses and a second sets of optical lenses, and with the second sets of optical lenses being swappable from the lens assemblies. Rotations of one or more sets of mirrors mounted on compensating gantries and a final mirror mounted on a build platform gantry can be used to direct the incident light from a precursor mirror onto the location of the top surface of the powder bed. Translational movements of compensating gantries and the build platform gantry are also able to ensure that distance of the incident light from the precursor mirror to the location of the top surface of the powder bed is substantially equivalent to the image distance. In effect, this enables a quick change in the optical beam delivery size and intensity across locations of a build area for different powdered materials while ensuring high availability of the system.

In certain embodiments, a plurality of build chambers, each having a build platform to hold a powder bed, can be used in conjunction with multiple optical-mechanical assemblies arranged to receive and direct the one or more incident energy beams into the build chambers. Multiple chambers allow for concurrent printing of one or more print jobs inside one or more build chambers. In other embodiments, a removable chamber sidewall can simplify removal of printed objects from build chambers, allowing quick exchanges of powdered materials. The chamber can also be equipped with an adjustable process temperature controls.

In another embodiment, one or more build chambers can have a build chamber that is maintained at a fixed height, while optics are vertically movable. A distance between final optics of a lens assembly and a top surface of powder bed a may be managed to be essentially constant by indexing final optics upwards, by a distance equivalent to a thickness of a powder layer, while keeping the build platform at a fixed height. Advantageously, as compared to a vertically moving the build platform, large and heavy objects can be more easily manufactured, since precise micron scale movements of the build platform are not needed. Typically, build chambers intended for metal powders with a volume more than ~0.1-0.2 cubic meters (i.e., greater than 100-200 liters or heavier than 500-1,000 kg) will most benefit from keeping the build platform at a fixed height.

In one embodiment, a portion of the layer of the powder bed may be selectively melted or fused to form one or more temporary walls out of the fused portion of the layer of the powder bed to contain another portion of the layer of the powder bed on the build platform. In selected embodiments, a fluid passageway can be formed in the one or more first walls to enable improved thermal management.

Improved powder handling can be another aspect of an improved additive manufacturing system. A build platform supporting a powder bed can be capable of tilting, inverting, and shaking to separate the powder bed substantially from the build platform in a hopper. The powdered material forming the powder bed may be collected in a hopper for reuse in later print jobs. The powder collecting process may be automated, and vacuuming or gas jet systems also used to aid powder dislodgement and removal Some embodiments of the disclosed additive manufacturing system can be configured to easily handle parts longer than an available chamber. A continuous (long) part can be sequentially advanced in a longitudinal direction from a first zone to a second zone. In the first zone, selected granules of a granular material can be amalgamated. In the second zone, unamalgamated granules of the granular material can be removed. The first portion of the continuous part can be advanced from the second zone to a third zone, while a last portion of the continuous part is formed within the first zone and the first portion is maintained in the same position in the lateral and transverse directions that the first portion occupied within the first zone and the second zone. In effect, additive manufacture and clean-up (e.g., separation and/or reclamation of unused or unamalgamated granular material) may be performed in parallel (i.e., at the same time) at different locations or zones on a part conveyor, with no need to stop for removal of granular material and/or parts.

In another embodiment, additive manufacturing capability can be improved by use of an enclosure restricting an exchange of gaseous matter between an interior of the enclosure and an exterior of the enclosure. An airlock provides an interface between the interior and the exterior; with the interior having multiple additive manufacturing chambers, including those supporting power bed fusion. A gas management system maintains gaseous oxygen within the interior at or below a limiting oxygen concentration, increasing flexibility in types of powder and processing that can be used in the system.

In another manufacturing embodiment, capability can be improved by having a 3D printer contained within an enclosure, the printer able to create a part having a weight greater than or equal to 2,000 kilograms. A gas management system may maintain gaseous oxygen within the enclosure at concentrations below the atmospheric level. In some embodiments, a wheeled vehicle may transport the part from inside the enclosure, through an airlock, since the airlock operates to buffer between a gaseous environment within the enclosure and a gaseous environment outside the enclosure, and to a location exterior to both the enclosure and the airlock.

Other manufacturing embodiments involve collecting powder samples in real-time in a powder bed fusion additive manufacturing system. An ingester system is used for in-process collection and characterizations of powder samples. The collection may be performed periodically and the results of characterizations result in adjustments to the powder bed fusion process. The ingester system can optionally be used for one or more of audit, process adjustments or actions such as modifying printer parameters or verifying proper use of licensed powder materials.

Yet another improvement to an additive manufacturing process can be provided by use of a manipulator device such as a crane, lifting gantry, robot arm, or similar that allows for the manipulation of parts that would be difficult or impossible for a human to move is described. The manipulator device can grasp various permanent or temporary additively manufactured manipulation points on a part to enable repositioning or maneuvering of the part.

Figure 4A:
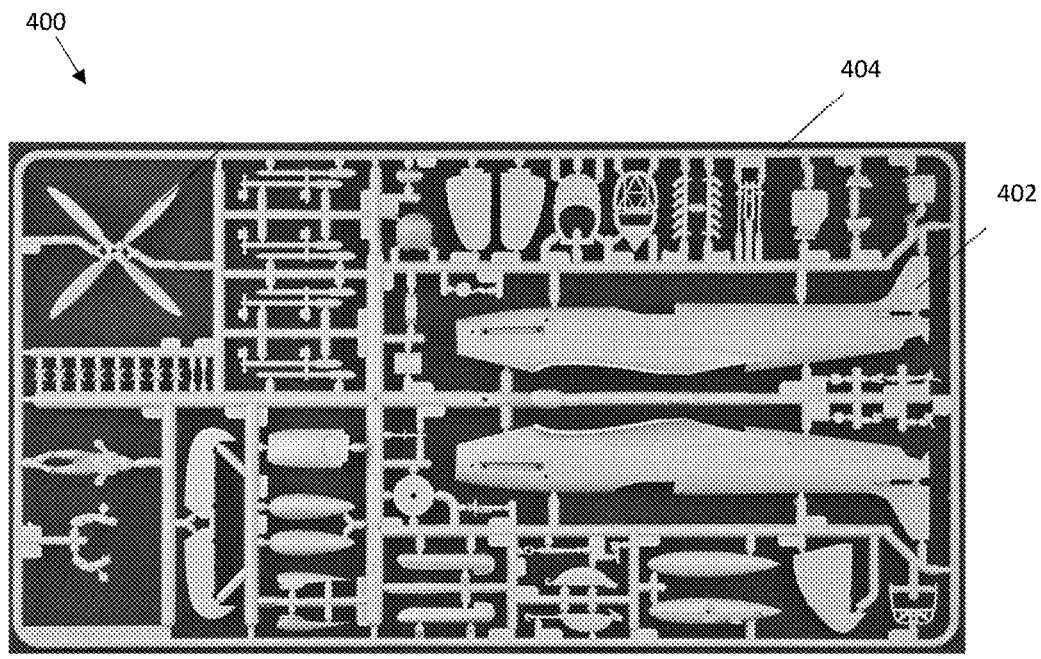
FIG. 4A illustrates an additively manufactured collection of parts supported by a surrounding additively manufactured structure able to act as a manipulation point.

FIG. 4A illustrates an additively manufactured collection of parts 400, with each part 402 supported by a surrounding additively manufactured manipulation point 404. As is evident from the Figure, a large variety of parts can be additively manufactured and attached with removable structures that support each part and allow pickup and maneuvering of the parts 400 with one or more manipulators (not shown). In the disclosed Figure, an outer perimeter surrounding the parts 400 would normally be a target for engagement with the manipulator, but in some embodiments, interior manipulation points can be engaged.

Figure 4B:
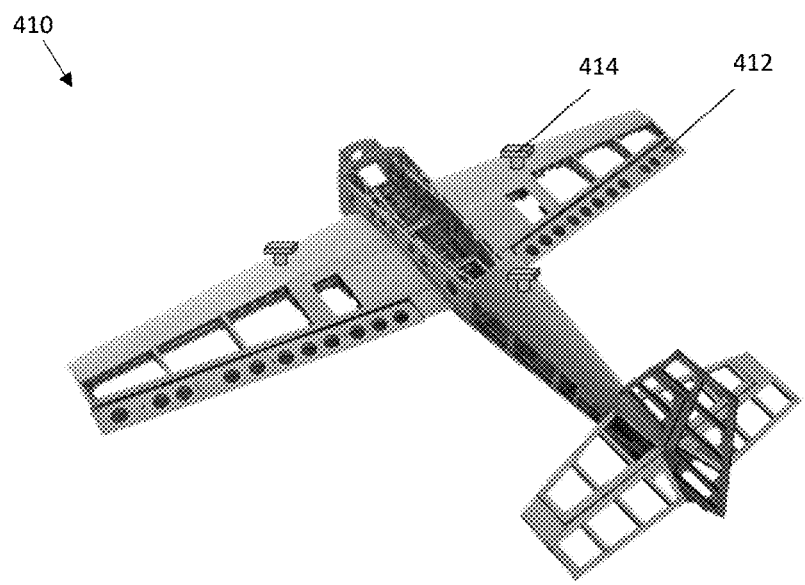
FIG. 4B illustrates an additively manufactured structure with additively manufactured manipulation points.

FIG. 4B illustrates another additively manufactured structure 410 that forms a portion of an aerial drone vehicle. The structure 412 can be supported by engagement of a manipulator with one or more manipulation points 414.

Figure 5A:
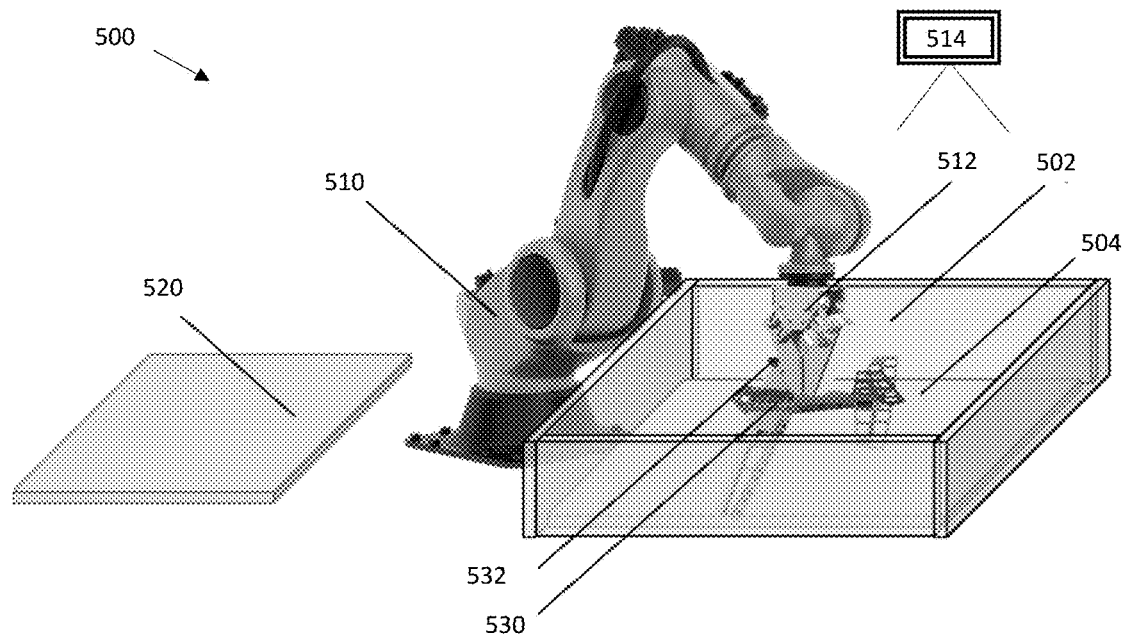
FIG. 5A illustrates a robot arm grasping a part by an additively manufactured manipulation point.

FIG. 5A illustrates an additive manufacturing system 500 that includes a powder chamber 502 with a powder bed 504. The system 500 can also include a processing platform 520, which can be a designated processing area, another powder chamber, a coating station, a conveyor, a shipping container, or any other needed manufacturing system component. The system 500 also includes a robot arm 510 with manipulator 512 capable of grasping a part 530 by its additively manufactured manipulation point 532. Sensor systems 534 can be mounted on the robot arm 510, or alternatively, on, in, or near the powder chamber 502.

While a six degree of freedom single robot arm with clamping graspers is a manipulation device shown in the Figure, other automated, mechanical or manual embodiments can be employed. For example, cranes, lifts, hydraulic arms, clamps, tracks or rails, pinning mechanisms, or any other type of manually or automatically controllable manipulation device can be used. A manipulation device can be mounted beside, on, near, or within the powder chamber 502. Alternatively, a manipulation device can be movably mounted on rails over, near, or positioned within the powder chamber. Multiple manipulation devices can be used in some embodiments A manipulation device can include position, depth, laser scanning, or similar sensor systems 514. Sensors can be mounted on or near the manipulator, elsewhere on the robot arm, or on, near, or within the powder chamber or processing platform 520. In certain embodiments, a sensor can be movable, with hinged, rail, hydraulic piston, or other suitable actuating mechanisms used to rotate, elevate, depress, oscillate, or laterally scan the sensor. In certain embodiments, conventional RGB CMOS or CCD sensors can be used, alone or in combination specialized depth sensors or optical edge tracking sense systems. Embodiments can be selected to improve 3D localization of a part, including identification and use guides, markers, or other detectable positioning indicia.

Figure 5B:
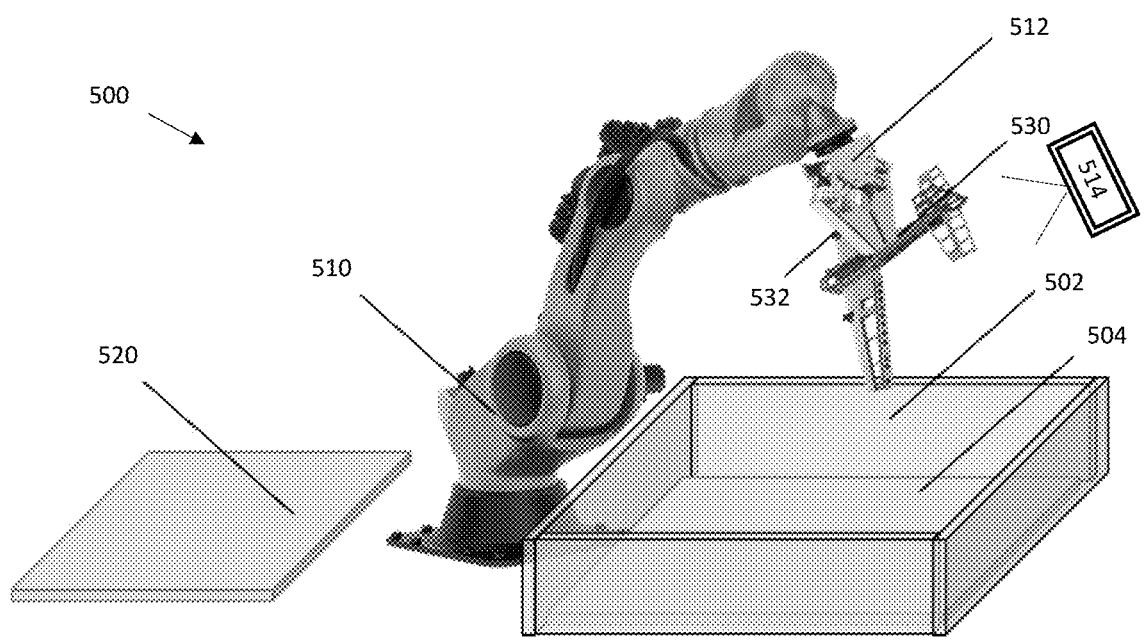
FIG. 5B illustrates a robot arm lifting and reorienting a part by its additively manufactured manipulation point.

FIG. 5B illustrates the system described with respect to FIG. 5A, with the robot arm 510 lifting and reorienting a part 530 by one of its additively manufactured manipulation points 532. In some embodiments, the part 530 can be lifted, rotated, linearly translated, and set back onto the powder bed 504 for further processing.

Figure 5C:
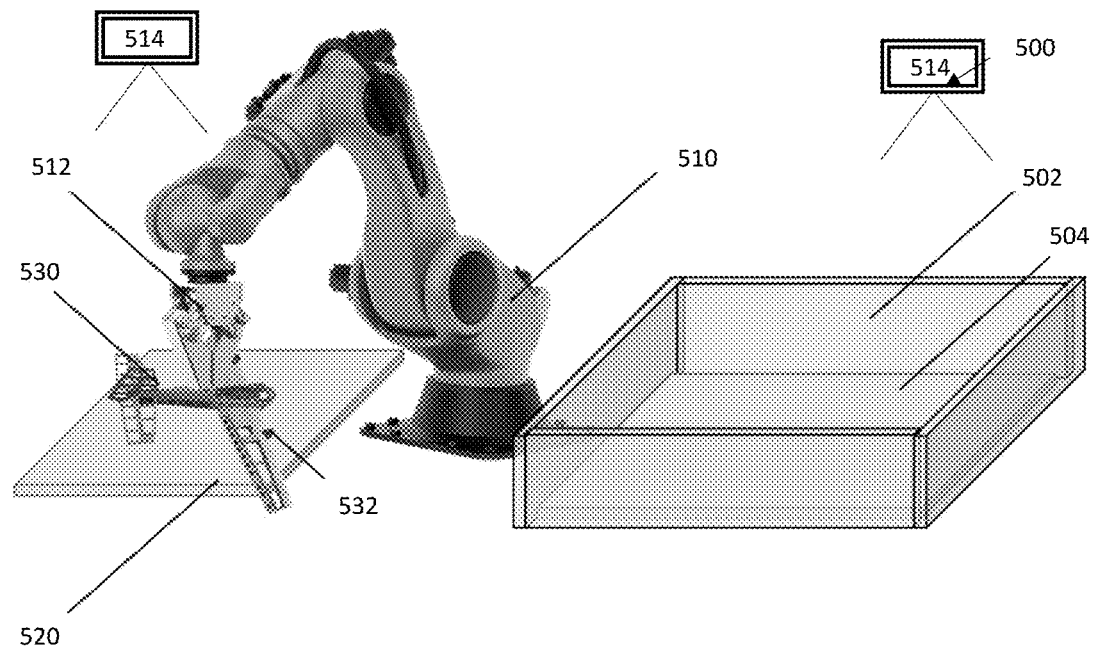
FIG. 5C illustrates a robot arm moving the part held by its additively manufactured manipulation point to another processing area.

FIG. 5C illustrates the system described with respect to FIG. 5A, with the robot arm 510 lifting and reorienting a part 530 by one of its additively manufactured manipulation points 532. In this embodiment, the part 530 lifted, rotated, and set onto the processing platform 520 for further processing.

Figure 6:
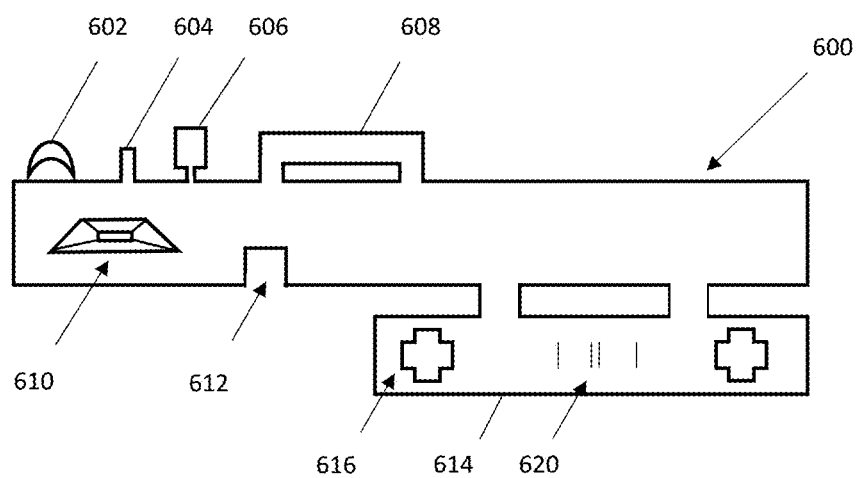
FIG. 6 illustrates a part including various possible additively manufactured manipulation points.

FIG. 6 illustrates a part 600 including various possible additively manufactured robot manipulation points. Part 600 supports various projecting structures (i.e. 602, 604, 606, 608, and 614), as well as internal structures or cavities (i.e. 610, 612, and 616), capable of acting as robot manipulation points. In the Figure, structure 602 is a lunate tab having two narrow connection points to part 600. The tab portion allows for easy engagement with manipulators having nipping or pinching graspers, while the narrow connection points simplify removal of the structure 602 by mechanical clipping, sawing, punching, or drilling; or by directed energy beams. Similarly, pin 604 is a small projecting structure capable of being engaged by nipping or pinching graspers, or by a "bit" holding type engagement system that surrounds and constricts to hold the pin 602. Rectangular tab 606 is attached at a single narrow point, allowing some embodiments of the manipulator to twist and break free the tab after the part has been moved to a desired area/position. Plate 608, again attached at two points to simplify later removal by mechanical clipping or energy beams, is relatively long and broad to simplify the engagement by the manipulator.

Additive manufacturing of the part 600 can be designed to include depressions, lands, cavities, holes, or other internally defined structures that do not greatly affect part function, but improve reliability of engagement with the robot arm. For example, prismatic locking cavity 610 can guide a pin or clamp system into engagement with the cavity. Alternatively, spreading grippers can be used to engage a notch 612 defined in the part 600. Cavities or openings 616 can also be defined in removable projecting tabs 614 if needed. In some embodiments, cavities or opening in a substantially additively manufactured part can be defined by subtractive machining, drilling, punching, or removal of material be etching or directed energy beams. In certain other embodiments, after use the cavities can be filled using additive manufacturing techniques, by use of thermoset plastics, or any other suitable fill technique.

In some embodiments, two or three-dimensional positioning of the part 600 can be improved by use of imaging or other optic sensors that identify precise position of the part using projecting tab or cavity position. In other embodiments, marking optical guides or indicia 620 can be additively formed or mechanically or laser inscribed on the projecting structure or the part itself to improved guidance for engagement of 3D positioning after movement.

Figure 7:
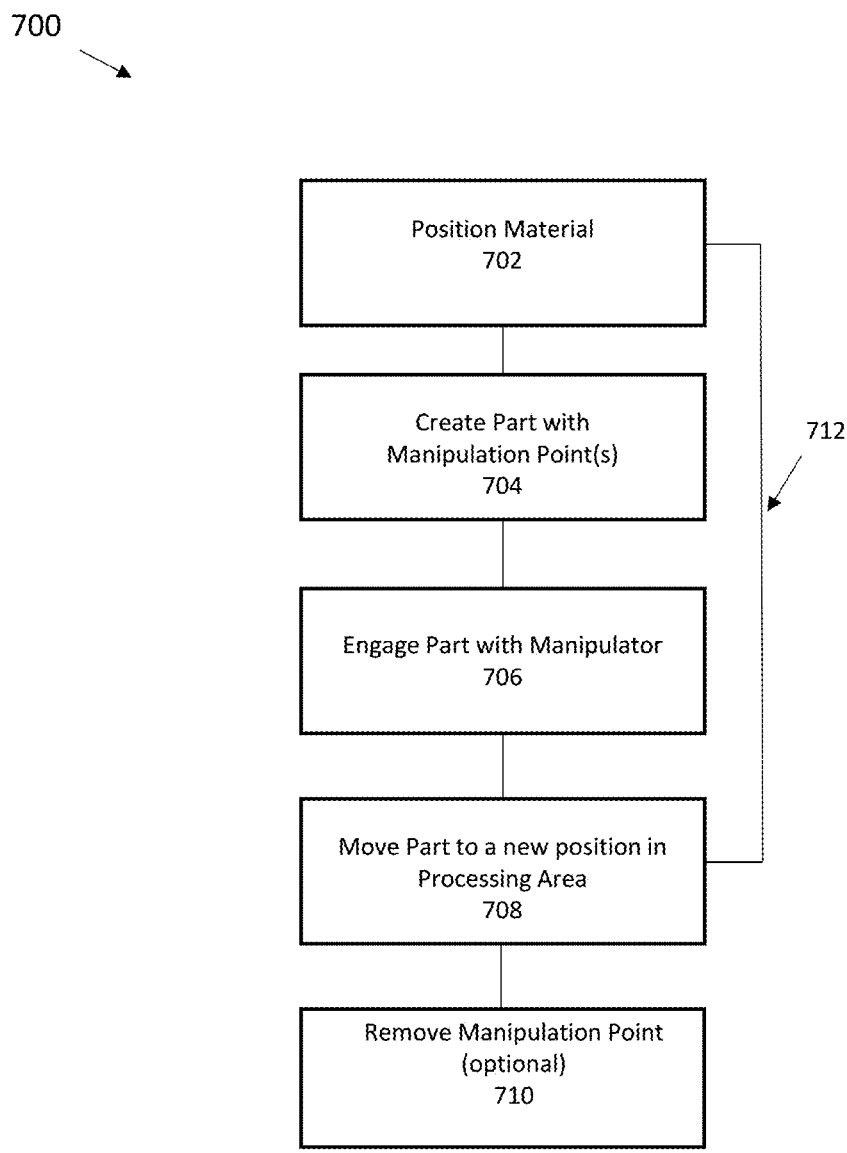
FIG. 7 is a flowchart illustrating one embodiment of a method for manufacturing that use manipulation points.

FIG. 7 is a flowchart 700 illustrating one embodiment of a method for additive manufacturing that uses manipulation points. In step 702, material is positioned on a powder bed in a powder chamber. In step 704, using directed beams of two-dimensionally patterned energy, a part is manufactured that includes one or more manipulation points. In step 706, the manipulator can engage the manipulation point, and lift the part away from a powder bed. The part can be repositioned on the powder bed for further processing, or alternatively moved (step 708) to a new processing area away from the powder bed and chamber. In an optional step 710, the manipulation point can be removed (e.g. a projecting tab is mechanically clipped), or infilled (e.g. additively defined holes or cavities filled with an epoxy resin). In optional step 712, parts moved to a new position can have additional material positioned and additively manufactured thereon.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims. It is also understood that other embodiments of this invention may be practiced in the absence of an element/step not specifically disclosed herein.

The invention claimed is:

1. A manufacturing method comprising the steps of:
   operating an additive manufacturing system comprising an energy source and a powdered material;
   performing, by the additive manufacturing system during the operating, an additive process comprising spreading successive layers of the powdered material and directing an energy beam from the energy source onto selected portions of the successive layers to form a structure embedded within an unfused portion of the powdered material, the structure (1) having a manipulation point, (2) comprising a plurality of additively manufactured parts connected together by one or more additively manufactured connecting links, and (3) comprising at least one optical guide or indicium additively formed therewith;
   separating, after the performing, the structure from the unfused portion of the powdered material;
   moving, after the performing, the structure using a manipulator device to engage the manipulation point, the moving comprising (1) using one or more optical sensors to sense the at least one optical guide or indicium and guide the manipulator device to the manipulation point, (2) lifting the structure by the manipulation point and point, and (3) transporting the structure to a processing area; and
   processing the structure after the moving, the processing comprising separating parts of the plurality of additively manufactured parts from each other by removing the additively manufactured connecting links,
   wherein the structure further comprises a prismatic locking cavity configured to guide the manipulator device in engaging the manipulation point, and
   wherein the manipulation point comprises:
      a projecting structure protruding outwardly from a side of the a part of the plurality of additively manufactured parts,
      a cavity within the part, and
      a notch on the side or another side of the part.

2. The method of claim 1, wherein:
   the manipulator device comprises a robot arm; and
   the at least one optical guide or indicium is on the manipulation point.

3. The method of claim 1, wherein the manipulation point includes the cavity and the notch, and wherein the processing further comprises filling the manipulation point.

4. The method of claim 1, wherein the processing further comprises altering surface characteristics of one or more parts of the plurality of additively manufactured parts.

5. The method of claim 4, wherein the altering comprises applying a coating to the one or more parts.

6. A method of manufacturing parts, the method comprising the steps of:

obtaining a powder material;

operating an additive manufacturing system, the operating comprising spreading successive layers of the powdered material and directing an energy beam onto selected portions of the successive layers to form a structure embedded within an unfused portion of the powdered material, the structure comprising a manipulation point and a plurality of additively manufactured parts connected together by one or more additively manufactured connecting links;

removing, after the operating, the structure from the additive manufacturing system;

moving, after the removing, the structure using a manipulator device to engage the manipulation point, the moving comprising (1) using one or more optical sensors to guide the manipulator device to the manipulation point, (2) lifting the structure by the manipulation point, and (3) transporting the structure to a processing area; and processing the structure after the moving, the processing comprising separating parts of the plurality of additively manufactured parts from each other by removing the additively manufactured connecting links, wherein the structure further comprises a prismatic locking cavity configured to guide the manipulator device in engaging the manipulation point, and wherein the manipulation point comprises:

a projecting structure protruding outwardly from a side of an additively manufactured part of the plurality of additively manufactured parts, a cavity within the additively manufactured part, and a notch on the side or another side of the additively manufactured part.

7. The method of claim 6, wherein:

the structure further comprises at least one optical guide or indicium additively formed therewith; and the using the one or more optical sensors to guide the manipulator device comprises sensing, by the one or more optical sensors, the at least one optical guide or indicium.

8. The method of claim 7, wherein the at least one optical guide or indicium is on the manipulation point.

9. The method of claim 6, wherein the manipulation point includes the cavity and the notch, and wherein the processing further comprises filling the manipulation point.

10. The method of claim 6, wherein the processing further comprises altering surface characteristics of one or more parts of the plurality of additively manufactured parts.

11. The method of claim 10, wherein the altering comprises applying a coating to the one or more parts.

12. A method of manufacture, the method comprising:

operating an additive manufacturing system;

performing, by the additive manufacturing system during the operating, an additive manufacturing process comprising spreading successive layers of a powdered material and directing an energy beam onto selected portions of the successive layers to form a structure embedded within an unfused portion of the powdered material, the structure comprising a manipulation point and a plurality of additively manufactured parts connected together by one or more additively manufactured connecting links;

lifting the structure away from the additive manufacturing system and changing an angle of orientation of the structure with respect to the additive manufacturing system;

moving, after the lifting and the changing, the structure using a manipulator device to engage the manipulation point, the moving comprising (1) using one or more optical sensors to guide the manipulator device to the manipulation point, (2) lifting the structure by the manipulation point, and (3) transporting the structure to a processing area; and conducting, after the lifting and the changing, a subtractive manufacturing process on the structure, the subtractive manufacturing process comprising separating parts of the plurality of additively manufactured parts from each other by removing the additively manufactured connecting links, wherein the structure further comprises a prismatic locking cavity configured to guide the manipulator device in engaging the manipulation point, and wherein the manipulation point comprises:

a projecting structure protruding outwardly from a side of a part of the additively manufactured parts, a cavity within the part, and a notch on the side or another side of the part.

13. The method of claim 12, wherein the manipulator device is a robotic arm.

14. The method of claim 12, wherein the additive manufacturing system comprises an energy source and an energy beam patterning unit.

15. The method of claim 14, wherein the energy beam originates with the energy source and is formed into a two-dimensional patterned energy beam by the energy beam patterning unit.

16. The method of claim 12, wherein:

the manipulation point further comprises at least one optical guide or indicium additively formed therewith; and the using the one or more optical sensors to guide the manipulator device comprises sensing, by the one or more optical sensors, the at least one optical guide or indicium.

* * * * *